United States Patent
Tiemeijer et al.

(10) Patent No.: US 10,381,447 B2
(45) Date of Patent: Aug. 13, 2019

(54) FIELD EFFECT TRANSISTOR AND METHOD OF MAKING

(71) Applicant: NXP B.V., Eindhoven (NL)

(72) Inventors: Lukas Frederik Tiemeijer, Eindhoven (NL); Viet Thanh Dinh, Leuven (BE); Valerie Marthe Girault, Overasselt (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/840,622

(22) Filed: Dec. 13, 2017

(65) Prior Publication Data

US 2019/0181234 A1 Jun. 13, 2019

(51) Int. Cl.
| H01L 29/40 | (2006.01) |
|---|---|
| H01L 29/417 | (2006.01) |
| H01L 23/66 | (2006.01) |
| H01L 23/528 | (2006.01) |
| H01L 29/423 | (2006.01) |
| H01L 23/522 | (2006.01) |
| H01L 29/78 | (2006.01) |
| H01L 27/02 | (2006.01) |

(52) U.S. Cl.
CPC .... *H01L 29/41758* (2013.01); *H01L 23/5226* (2013.01); *H01L 23/5283* (2013.01); *H01L 23/66* (2013.01); *H01L 29/401* (2013.01); *H01L 29/42376* (2013.01); *H01L 27/0207* (2013.01); *H01L 29/785* (2013.01)

(58) Field of Classification Search
CPC ............. H01L 29/66795; H01L 29/785; H01L 29/4238; H01L 29/0696; H01L 27/0207; H01L 2924/00; H01L 23/48234

USPC .................. 257/288, 401, 211; 438/128, 129
See application file for complete search history.

(56) References Cited

U.S. PATENT DOCUMENTS

| 6,376,886 B2 | 4/2002 | Mizuhara |
| 6,566,185 B2 | 5/2003 | Inoue et al. |
| 6,630,715 B2 | 10/2003 | Parker et al. |
| 6,767,779 B2 | 7/2004 | Parker et al. |
| 7,414,275 B2 | 8/2008 | Greenberg et al. |
| 7,928,517 B2 * | 4/2011 | Tiemeijer ............ H01L 23/4824 257/341 |
| 8,178,908 B2 | 5/2012 | Greenberg et al. |
| 8,455,924 B2 * | 6/2013 | Greenberg ............ H01L 23/528 257/203 |
| 8,513,707 B2 | 8/2013 | Herberholz |

(Continued)

*Primary Examiner* — Thinh T Nguyen

(57) ABSTRACT

A Field Effect Transistor (FET) capable of operating at high frequencies and includes comb-shaped source and drain electrodes. The comb-shaped drain electrode includes a plurality of thin comb-shape drain electrode layers at corresponding levels of the FET, each comb-shaped drain electrode layer including a plurality of drain electrode fingers having substantially the same width as the comb-shaped drain electrodes of each other layer. The comb-shaped source electrode includes a plurality of comb-shape source electrode layers at the corresponding levels, each comb-shaped drain electrode layer including a plurality of drain electrode fingers having substantially the same width as the comb-shaped source electrodes of each other layer. In addition, the inter-level retraction of adjacent drain electrode layers is the same or substantially the same. Similarly, the inter-level retraction of adjacent source electrode layers is the same or substantially the same.

20 Claims, 5 Drawing Sheets

(56) References Cited

U.S. PATENT DOCUMENTS

| | | |
|---|---|---|
| 8,872,279 B2 | 10/2014 | Greenberg et al. |
| 9,190,479 B1 | 11/2015 | Greenberg et al. |
| 2007/0187780 A1* | 8/2007 | Tiemeijer ............ H01L 23/4824 257/401 |
| 2008/0237648 A1* | 10/2008 | Greenberg ............ H01L 23/528 257/211 |
| 2009/0152649 A1 | 6/2009 | Kim |
| 2011/0241126 A1 | 10/2011 | Herberholz |
| 2014/0027862 A1 | 1/2014 | Herberholz |

* cited by examiner

FIELD EFFECT TRANSISTOR AND METHOD OF MAKING

FIELD OF THE DISCLOSURE

The present disclosure relates to integrated circuit devices and devices having integrated circuit devices, and more particularly to devices having high frequency field effect transistors.

BACKGROUND OF THE DISCLOSURE

Advancements in semiconductor device processing can allow for the manufacture of scaled-down channel length transistors. These scaled-down channel lengths can enable better intrinsic Radio Frequency (RF) characteristics of RF Field Effect Transistors (RF-FETs). However, at the same time it becomes more difficult to wire these RF FET devices in a way that provides acceptable amounts of parasitic capacitance and electro-migration, such that these improvements of RF characteristics can be maintained for the large gate widths needed in RF products

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Unless stated otherwise, the term "length" as used herein with respect to a transistor feature is intended to refer to a dimension as measured in the direction of current flow through a channel region of the transistor, and the term "width" is intended to refer to a dimension as measured in the direction that is orthogonal the length dimension. A Field Effect Transistor capable of operating at radio frequencies (RF) in excess of 1 GHz includes a comb-shaped gate, source, and drain electrodes to reduce the effective gate resistance. The comb-shaped drain electrode including a plurality of comb-shape drain electrode layers formed from thin metal routing layers at corresponding levels of the RF-FET, each comb-shaped drain electrode layer including a plurality of drain electrode fingers having substantially the same length and width as the comb-shaped drain electrodes of each other layer. The comb-shaped source electrode including a plurality of comb-shape source electrode layers formed from thin metal routing layers at the corresponding levels. Each comb-shaped source electrode layer including a plurality of source electrode fingers having substantially the same length and width as the comb-shaped source electrodes of each other layer. The inter-level retraction of one or both of the adjacent drain electrode layers and the adjacent source layers is the same or substantially the same. Such an RF-FET can be useful in RF applications, including automotive radar applications.

Figure 1:
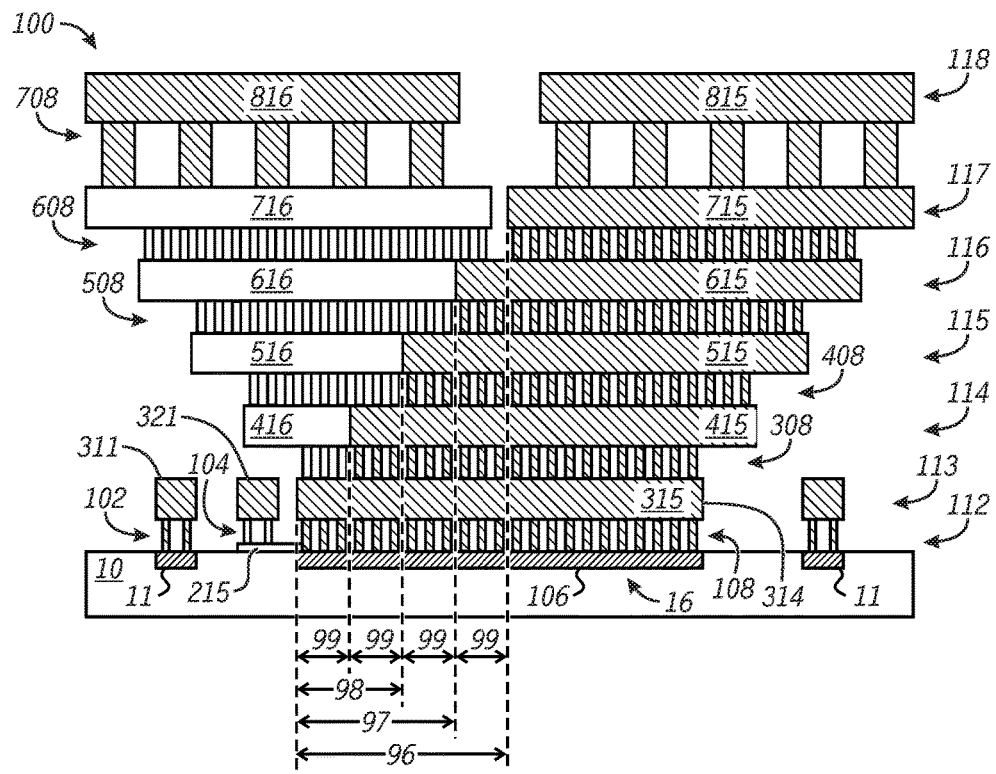
FIG. 1 is a side view of a field effect transistor in accordance with a specific embodiment of the present disclosure.

FIG. 1 illustrates a side view of a layout of portions of a Radio Frequency Field Effect Transistor (RF-FET) 100 manufactured in accordance with the present disclosure. By way of example, the RF-FET 100, also referred to herein as FET 100, is illustrated to have a level 112 at which a gate layer is formed, and levels 113-118 at which routing layers are formed. The five metal routing layers at levels 113-117 can be referred to as local metal routing layers, and have thicknesses that are thin enough to allow even dense areas of small standard FET devices to be interconnected. The thin metal routing layers have a thickness that is less than the thickness of the global metal routing layers, such as the metal routing layer of level 118. Therefore, the local metal routing layers at levels 113-117 are referred to herein as "thin metal layers", while the global metal routing layer at level 118 is referred to herein as a "thick metal layer". According to an embodiment, a ratio of the thickness of each thin metal layer to the thick metal layer is 1:2 to 1:10. The layout and manufacture of FET 100 will be better understood with reference to FIGS. 2-8, wherein FIGS. 2 and 3 show overhead views of alternate gate layer embodiments at level 112 of FET 100, and FIGS. 4-9 illustrate overhead views from other levels of RF-FET 100.

During manufacturing of the FET 100, a semiconductor substrate 10 is provided that can have a plurality of die locations, each die location having a transistor location at which FET 100 is to be formed. By way of example, it is presumed that substrate 10 is a p-type substrate.

Figure 2:
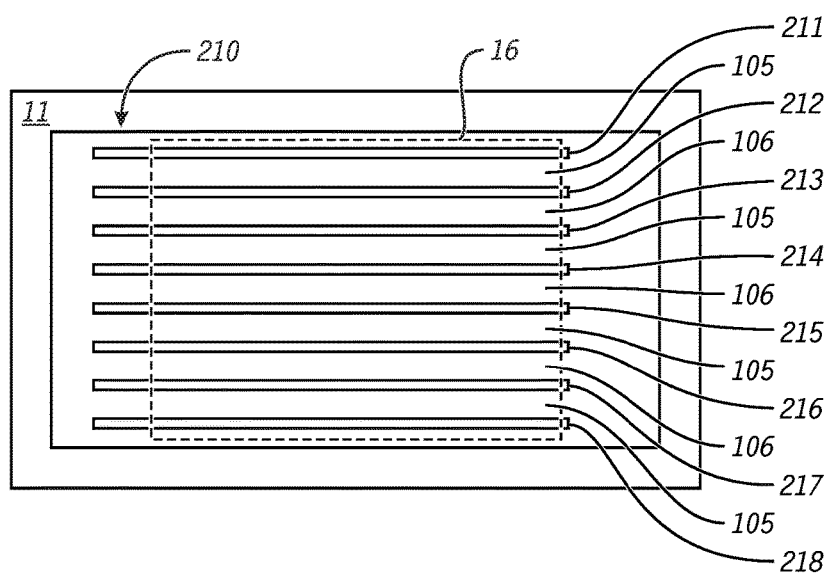
FIG. 2 is a top view of the field effect transistor of FIG. 1 showing various features at and below a particular level.

FIG. 2 is an overhead view of FET 100 that illustrates various features illustrated at FIG. 1 that have been formed at or below level 112. According to an embodiment, an oxide definition process has been applied to define an active region 16 and a bulk substrate contact ring region 11. Next, a plurality of gate fingers 211-218 are formed at a gate level 210 of FET 100 having a gate oxide dielectric layer and conductive gate layer (not individually shown). Fingers 211 and 218 are dummy gate fingers that can be formed to ensure uniformity amongst the other gate fingers 212-217 during manufacturing. The gate fingers 212-217 are electrically connected by a gate-end interconnect 312 that resides at an overlying metal layer, as shown in FIG. 1 by gate finger 215. The gate fingers 211-218 can be formed of various conductive materials, such as polysilicon, metal, the like, and combinations thereof. By way of example, it is assumed that gates finger of FIG. 2 are metalized polysilicon. Each gate finger extends in the width direction beyond the active region 16, and, therefore, defines corresponding p-type channel regions of the FET 100, and corresponding locations of n-type source and drain diffusion regions 105 and 106 between the p-type channel regions, that will be subsequently formed by source and drain implants.

Figure 3:
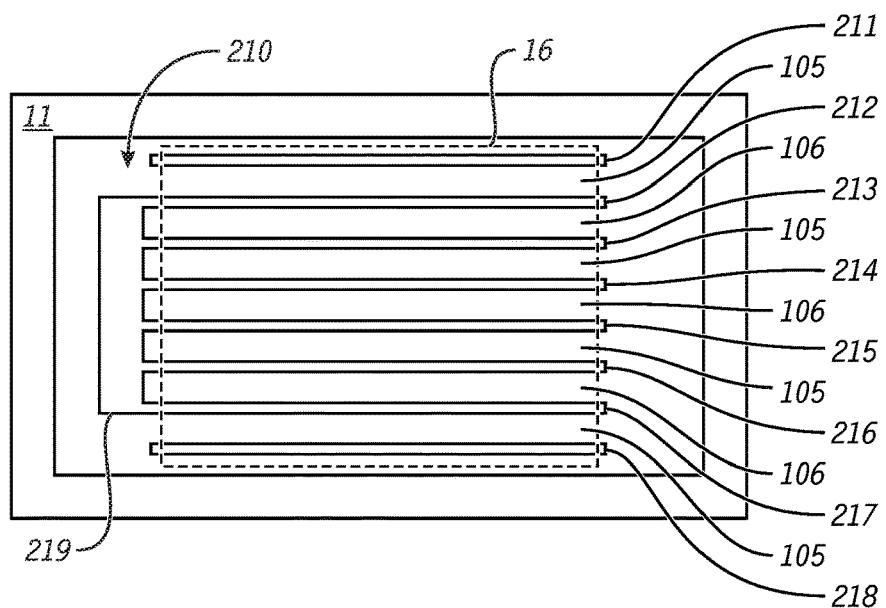
FIG. 3 is a top view of the field effect transistor of FIG. 1 showing an alternate embodiment of various features at and below a particular level.

FIG. 3 illustrates an alternate embodiment of a gate level 210, and therefore is not shown in FIG. 1. The gate level of FIG. 3 differs from the gate level of FIG. 2 in that it has gate fingers 212-217 that are electrically connected together by a gate-end interconnect 219 that is part of the gate level 210, instead of by an overlying gate-end interconnect. The gate-end interconnect 219 does not overlie the active region 16. In both the embodiments of FIG. 2 and FIG. 3 it could be beneficial to connect the gate from both side to further reduce the effective gate resistance.

Figure 4:
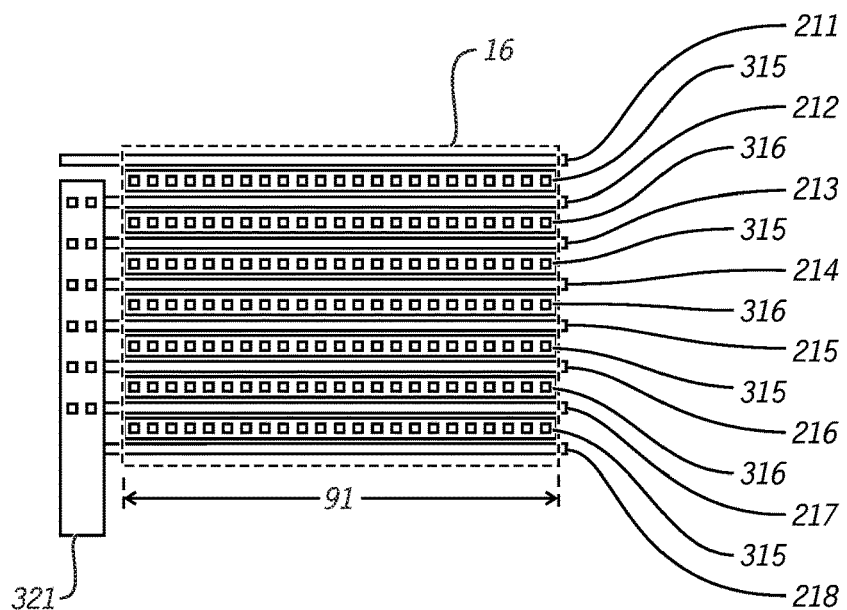
FIG. 4 is a top view of the field effect transistor of FIG. 1 showing various features at and below a particular level above that of FIG. 2.

Next, referring to FIG. 1 and FIG. 4, a first thin metal routing layer is formed at level 113 that is connected to various locations in the conductive gate level 210, the source regions 105, the drain regions 106, and the substrate contact ring 11 by corresponding contacts. For example, contacts 102 connect a portion 311 of the routing layer at level 113 to an underlying portion of bulk substrate routing region 11. Contacts 104 connect a gate-end interconnect portion 321 of the routing layer at level 113 to corresponding underlying gate fingers 212-217 or the gate-end interconnect 219. Contacts 108 connect source/drain electrodes of the routing layer at level 113 to corresponding underlying source/drain contact regions 105 and 106.

Each source electrode finger 315 overlies the entire width of a corresponding source diffusion region 105, thus providing 100% inter-level interleaving between the source electrode fingers 315 and the source diffusion region 105, which corresponds to the entire width of the active region 16, e.g., the width of the source drain diffusion regions 105 and 106. The interleaving between source electrode fingers 315 and their respective source diffusions regions results in a current flow through each finger that is substantially orthogonal to length and width directions of the transistor. Likewise, each drain electrode finger 316 is 100% interleaved with its corresponding drain diffusion region 106. The number of contacts 108 that are connected between each source/drain electrode finger and its underlying source/drain contact region can be maximized based upon the design rules of a particular technology. For example, the number of contacts can be determined by the equation:

_Contacts=Width_Finger/($W$_Contact+$S$_Contact),
where

Width_Finger is the width of the source/drain fingers;
W_Contact is the width of a contact; and
S_Contact is the minimum spacing required between each contact.

The dimensions of the thin metal routing layer at level 113 used to implement the disclosed embodiment can vary by process node. For example, for a 28 nm process node, the nominal thickness of the routing layer at level 113 is about 90 nm. The length of a source/drain electrode finger of the FET 100 can be in the range of 50-90 nm. The width of a source/drain electrode finger of the FET 100 can be in the range of 300 nm-3 um, with a typical source/drain electrode width of about 1 um. A typical contact length and width is about 50 nm, and the minimum contact spacing is about 80 nm. For a 40 nm process node, the nominal thickness of the routing layer at level 113 can be about 140 nm. The length of a source/drain electrode finger of the FET 100 can be in the range of 70-150 nm. The width of a source/drain electrode finger of the FET 100 can be in the range of 500 nm-5 um, with a typical source/drain electrode width of about 1 um. A typical contact length and width is about 70 nm, and the contact spacing should be at least 70 nm. The term "about" in reference to various measurements is intended to refer to a range of –/+10% the indicated measurement, unless stated otherwise.

FIG. 4 is an overhead view of FET 100 that illustrates the location of various metal routing and other features of FET 100 that have been formed at or below the level 113, including the location of the gate fingers 211-218 and the location of a gate electrode 321, and the location of the source and drain electrode layers that include fingers 315 and 316. As viewed from overhead, the gate fingers 212-217 of gate structure 210 in combination with the gate-end interconnect 321 form what is referred to herein as "a comb-shaped" structure. For this reason, the FET 100 can also be referred to as a comb-shaped FET, the gate fingers 212-217 can be referred to as a comb-shaped gate, or comb-shaped fingers, and the source/drain electrode fingers 315 and 316 can be referred to as comb-shaped electrodes. While the gate structure of FET 100 is illustrated as being single ended, e.g., only one side of the gate fingers 212-217 are connected to a gate-end interconnect, it will be appreciated that a double-ended gate structure can also be used, and that the term "comb-shaped" as used herein is intended to also refer transistors having double-ended gate structures.

The term "overlying", and its variants, as used herein with reference to two features is intended to indicate that a feature (the overlying feature) is further from the major surface of the substrate 10, in a direction orthogonal to the major surface of the substrate 10, than the other feature, and that at least a portion of the other feature is directly between the substrate 10 and the overlying feature in the orthogonal direction. The term "underlying", and its variants, as used herein with reference to two features is intended to indicate that a feature (the underlying feature) is closer to a major surface of the substrate 10, in a direction orthogonal to the major surface, than the other feature, and that at least a portion of the underlying feature is directly between the substrate and the other feature in the orthogonal direction.

Each source electrode finger 315 has a width dimension 91 and overlies a corresponding source diffusion region 105. Each drain electrode finger 316 also has a width dimension 91 and overlies a corresponding source diffusion region 106. The intra-level interleaving of the source and drain electrode fingers 315 and 316 to each other at level 3 is 100%. The inter-level interleaving of electrode fingers 315 and 316 at level 3 and their underlying source/drain diffusion regions is also 100%.

Figure 5:
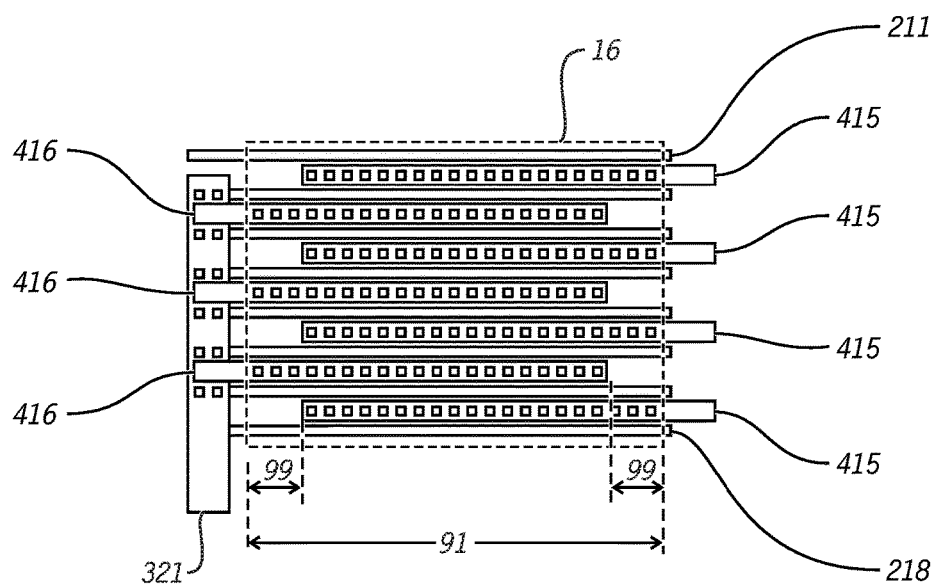
FIG. 5 is a top view of the field effect transistor of FIG. 1 showing various features at and below a particular level above that of FIG. 4.

Next, referring to FIG. 1 and FIG. 5, a second thin metal routing layer is formed at level 114 (see FIG. 1) that is connected to various locations of the first metal routing layer at level 113. For example, vias 308 connect source electrode fingers 415 and drain electrode fingers 416 of the second metal routing layer to corresponding source electrode fingers 315 and drain electrode fingers 316 of the first metal routing layer; thus, vias 308 electrically connect the source and drain electrode fingers 415 and 416 to their corresponding source and drain diffusion regions. Each of the source and drain electrodes 415 and 416 have a width dimension 91, which is the same width dimension as the source and drain electrodes 315 and 316 of the first metal layer. The thickness, length and width of the second routing layer can be the same or about the same as that of the routing layer of level 113.

Each source electrode finger 415 has been retracted from its corresponding underlying source finger 315 by a retraction dimension 99. Because of this retraction, an amount of inter-level interleaving between source electrode fingers 415 of level 114 and corresponding source electrode fingers 315 of level 113 is achieved that is different than the amount of inter-level interleaving between source electrode fingers 315 and corresponding source diffusion regions 105. For example, while the amount of inter-level interleaving between source electrode fingers 315 and their corresponding source diffusion regions 105 is 100%, the amount of inter-level interleaving between source electrode fingers 415 and their corresponding source electrode fingers 315 is less than 100% because only a portion of the source finger 415 overlies its corresponding finger 315. This difference in inter-level interleaving results in fewer vias 308 between fingers 415 and 315 than contacts 108 between fingers 315 and diffusion regions 105, assuming similar design rule dimensions apply to both vias 308 and contacts 108. Because finger 415 is retracted from finger 315 in the width direction by the dimension 91, some of the current entering finger 315 in the vertical direction from vias 308 will flow horizontally, in the width direction to the left of FIG. 1, before flowing vertically to the drain region 106 through the left-most three vias 108. Similarly, each drain finger 416 has been retracted from its corresponding underlying source finger 315 by the retraction dimension 99.

It can be desirable for the retraction dimension 99 to be chosen so that, when applied to each successive thin metal routing layer, there is no source and drain electrode intra-level interleaving at an upper most thin metal routing layer of the FET 100 (see features 715 and 716 of FIG. 1). Accordingly, the retraction dimension can be based on the equation:

Retraction_Dimension=(Width_Finger+SD_Spacing)/
(2*(#_of_Thin_Metal_Layers−1)); where Width_Finger is the width of the source and drain fingers of FET 100;
SD_Spacing is the required source-to-drain spacing between fingers in the top thin metal layer; and
_of_Thin_Metal_Layers is the number of thin metal layers of the FET 100, which is five in the present example.

Thus, in the present example, assuming retraction occurs amongst five layers of thin metal routing, the SD_Spacing to be zero (0), and the finger width to be equal to the channel width of the transistor, the inter-level retraction dimension 99 will be calculated to be about 12.5% of the dimension 91, resulting in an inter-level interleaving of about 87.5% between source electrode fingers 315 and 415 of levels 113 and 114. The drain electrode fingers 416 are retracted from the drain electrode fingers 316 by the retraction dimension 99, in the opposite direction as fingers 415. It will be appreciated that the SD_Spacing dimension has been chosen to be zero for ease of discussion, but will typically not be zero due to design rule considerations. For example, depending upon the process used to manufacture the FET 100, the ratio of the SD_Spacing dimension to via/contact spacing dimension can be in the range of 1:1 to 3:1, e.g., the SD_Spacing dimension can be in the range of 70-210 nm for a particular example.

FIG. 5 is an overhead view of FET 100 that illustrates the location of features that have been formed at or below the level 114, including the location of the gate electrode 321, a comb-shaped source electrode layer of FET 100 that includes a plurality of source electrode fingers 415, a comb-shaped drain electrode of FET 100 layer that includes a plurality of drain electrode fingers 416, and vias 308 (reference number not shown in FIG. 5). Because the source fingers 415 and drain fingers 416 are being retracted in opposite directions, the intra-level interleaving between source electrode fingers 415 and drain electrode fingers 416 is about 75% at level 114, e.g., only 75% of the width of the source and drain fingers 415 and 416 at level 114 overlap. Also shown at FIG. 5 is the inter-level interleaving dimension 99 between the source and drain electrode fingers 415 and 416, and the active region 16, which is 87.5%.

Because it is generally desirable to maximize the number of vias between metal layers in order to reduce the current density in each via, which is responsible for electro-migration, the number of vias between the first and second thin metal routing layers can be determined by the equation:

_Vias=floor(Width_Finger−Retraction_Dimension)/
(Width_Via+Space_Via), where

Width_Finger is the width of the source/drain fingers;
Retraction_Dimension is the retraction amount determined above;
W_Via is the width of a via; and
S_Via is the minimum spacing between each via.

According to an embodiment, for a 28 nm process node, a via width can be about 50 nm, and the via spacing would be about 80 nm or slightly larger. For 40 nm process node using the technique described herein, the via width can be about 70 nm, and the via spacing would be about 70 nm or slightly larger.

Figure 6:
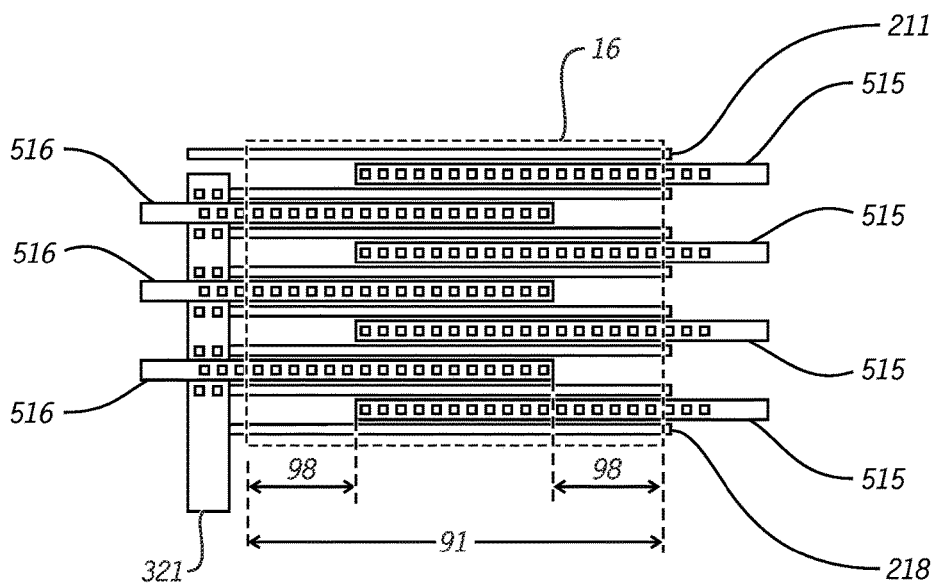
FIG. 6 is a top view of the field effect transistor of FIG. 1 showing various features at and below a particular level above that of FIG. 5.

Next, referring to FIG. 1 and FIG. 6, a third thin metal routing layer is formed at level 115 that is connected to various locations of the second metal routing layer. For example, vias 408 connect source and drain electrode fingers 515 and 516 of the third metal routing layer to corresponding source and drain electrode fingers 415 and 416 of the second metal routing layer. Each of the source and drain electrodes 515 and 516 have the width dimension 91, which is the same as for the source and drain electrodes 415 and 416 of the second metal layer. The source and drain electrodes 515 and 516 are retracted in opposite directions from their underlying source and drain electrodes by the retraction dimension 99. The thickness of the third thin metal routing layer of level 115 can be the same as the thickness of the routing layer of level 114.

Each source electrode finger 515 has the same width dimension 91 as source electrode finger 415, and has been retracted from its corresponding underlying source fingers 415 by the retraction dimension 99, which results in a retraction dimension 98 (FIG. 5) between each source electrode finger 515 and its corresponding source diffusion region 105. This retraction of source electrode fingers results in an inter-level interleaving between source electrode fingers 515 of level 115 and corresponding source electrode fingers 415 of level 114 that is substantial the same as the inter-level interleaving between source electrode fingers 415 and corresponding source electrode finger 315, which is about 87.5%. Further, the inter-level interleaving of the source electrode fingers 515 and the source electrode fingers 315 of level 113 is about 25%. The drain electrode fingers 516 of level 115 are similarly retracted from their corresponding drain electrode fingers 416 by the retraction dimension 99.

The term "substantially the same" as used herein with respect to the amount of difference between inter-level retractions of comb-shaped electrodes is intended to refer to the difference in inter-level retraction that is less than 10%, which includes a retraction of less than 5%, a retraction of less than 4% a retraction of less than 3%, a retraction of less than 2%, and a retraction of less than 1%. For example, the inter-level retraction between source electrode 415 and source electrode 515 is substantially the same as the inter-level retraction between source electrode 315 and 415, by virtue of the two retractions being the same, e.g., dimension 99. However, even if the retraction between source electrodes 415 and source electrodes 515 was greater than the retraction between source electrodes 315 and 415 they would be considered substantially the same, so long as the difference is less than 10% of the retraction between source electrodes 415 and 515.

FIG. 6 is an overhead view of FET 100 that illustrates the location of features that have been formed at or below the level 115 (FIG. 1) including the location of the gate electrode 321, a comb-shaped source electrode layer of FET 100 that includes a plurality of source electrode fingers 515, a comb-shaped drain electrode layer FET that includes a plurality of drain electrode fingers 516, and vias 408 (reference number not shown in FIG. 5). Because the source fingers 515 and drain fingers 516 are being retracted in opposite directions at level 115, the intra-level interleaving between source electrode fingers 515 and drain electrode fingers 516 is about 50% at level 115, e.g., only 50% of the width of the source and drain fingers overlap.

Figure 7:
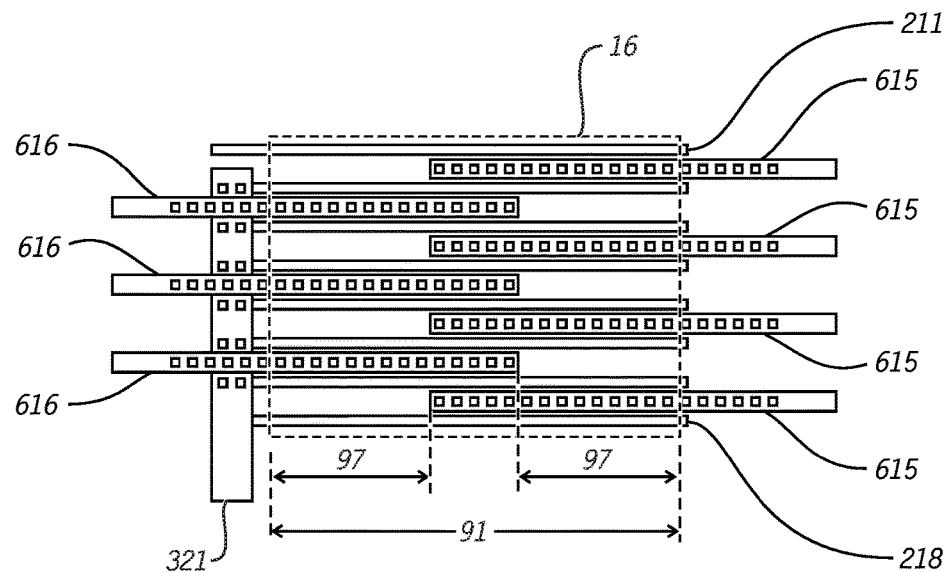
FIG. 7 is a top view of the field effect transistor of FIG. 1 showing various features at and below a particular level above that of FIG. 6.

Next, referring to FIG. 1 and FIG. 7 a fourth thin metal routing layer is formed at level 116 that is connected to various locations of the third metal routing layer. For example, vias 508 connect source and drain electrode fingers 615 and 616 of the third metal routing layer to corresponding source and drain electrode fingers 515 and 516 of the second metal routing layer. Each of the source and drain electrodes 615 and 616 have the dimension 91, which is the same dimension as the source and drain electrodes 515 and 516 of the third metal layer. Source and drain electrode 615 and 616 have been retracted in opposite directions from their underlying source and drain electrodes by the retraction dimension 99. The thickness of the fourth thin metal routing layer can be the same or about the same as the thickness of the routing layer of level 115.

Each source electrode finger 615 has the same width dimension 91 as source electrode fingers at lower levels, and has been retracted from its corresponding underlying source finger 515 by the retraction dimension 99, which results in a retraction dimension 97 (FIG. 6) between each source electrode finger 615 and its corresponding source diffusion region 105. This retraction of source electrode fingers results in an inter-level interleaving between source electrode fingers 615 of level 116 and corresponding source electrode fingers 515 of level 115 that is the same as the inter-level interleaving between source electrode fingers 515 and corresponding source electrode finger 415, which is about 87.5%. Further, the inter-level interleaving of the source electrode fingers 615 and the source electrode fingers 315 of level 113 is 37.5% or about 37.5%. The drain electrode fingers 616 of level 116 are similarly retracted from their corresponding drain electrode fingers 516 by the retraction dimension 99.

FIG. 7 is an overhead view of FET 100 that illustrates the location of features that have been formed at or below the level 116 (FIG. 1) including the location of the gate electrode 321, a comb-shaped source electrode layer of FET 100 that includes a plurality of source electrode fingers 615, a comb-shaped drain electrode layer of FET 100 that includes a plurality of drain electrode fingers 616, and vias 508 (reference number not shown in FIG. 6). Because the source fingers 615 and drain fingers 616 are being retracted in opposite directions at level 116, the intra-level interleaving between source electrode fingers 615 and drain electrode fingers 616 is about 25% at level 116.

Figure 8:
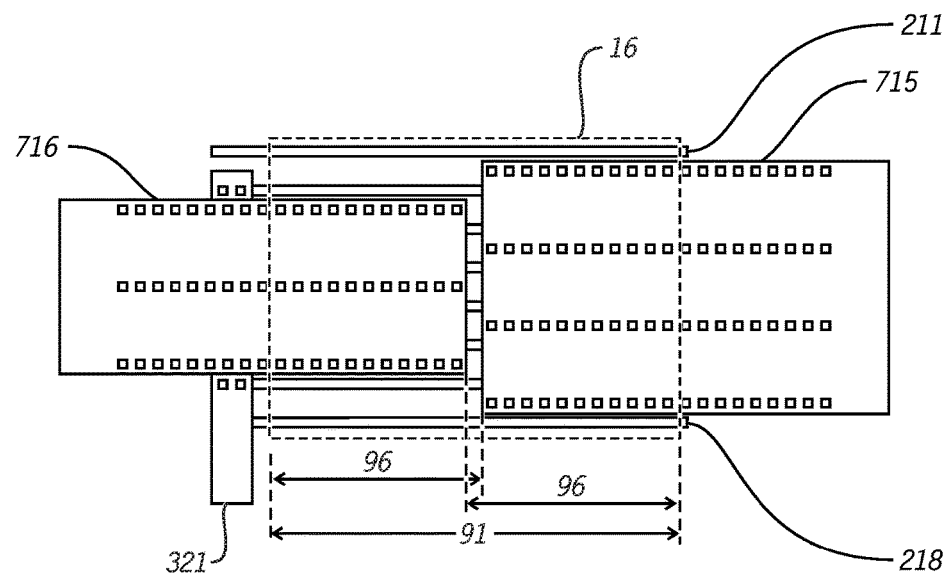
FIG. 8 is a top view of the field effect transistor of FIG. 1 showing various features at and below a particular level above that of FIG. 7.

Next, referring to FIG. 1 and FIG. 8, a fifth thin metal routing layer is formed at level 117 that is connected to various location of the fourth metal routing layer. For example, vias 608 connect source and drain electrodes 715 and 716 of the fifth thin metal routing layer to corresponding source and drain electrodes 615 and 616 of the fourth thin metal routing layer. Each of the source and drain electrodes 715 and 716 have the width dimension 91, which is the same dimension as the source and drain electrodes 615 and 616 of the fourth metal layer, and have been retracted in opposite directions from their underlying source and drain electrodes by the retraction dimension 99. This retraction of source and drain electrode fingers results in an inter-level interleaving between the source electrode 715 of level 117 and corresponding source diffusion region 105, and electrode fingers 615 of level 116 that is about 87.5%. Further, the inter-level interleaving of the source electrode and drain fingers 715 and the source electrode fingers 315 of level 113, is 50%. Because the source electrode 715 and drain electrode 716 are retracted in opposite directions at level 117 the intra-level interleaving between source electrode finger 715 and drain electrode finger 716 is 0% at level 117.

FIG. 8 is an overhead view of FET 100 that illustrates the location of features that have been formed at or below the level 117 (FIG. 1) including the location of the gate electrode 321, a rectangular-shaped source electrode layer 715 of FET 100, a rectangular drain electrode layer 716 of FET 100, and vias 608 (reference number not shown in FIG. 7). Unlike electrodes of the FET 100 formed at previous thin metal routing layers, since the intra-level interleaving between the source and drain electrodes 715 and 716 at level 117 is 0% it is no longer necessary to include a plurality of fingers, but instead each source/drain electrode can be made as a single rectangular shaped electrode, although in other embodiments electrode fingers of intermediate length sufficient for the landing of vias 708 could be maintained. The thickness of the fifth thin metal routing layer can be the same or about the same as the thickness of the routing layer of level 116.

As illustrated, the single rectangular source electrode 715 is retracted from its corresponding source fingers 615 by the retraction dimension 99, which results in a retraction dimension 96 between the rectangular source electrode 715 and its corresponding source diffusion region 105. Similarly, the drain electrode fingers 715 are retracted from its corresponding drain electrode fingers 615 by the retraction dimension 99. The result of this retraction is that there is no intra-level interleaving between the source and drain electrodes, allowing for rectangular source and drain electrodes to be used instead of finger-shaped electrodes, so long as the intra-level spacing between the source and drain electrodes is sufficient to meet required design rules of the process node.

Figure 9:
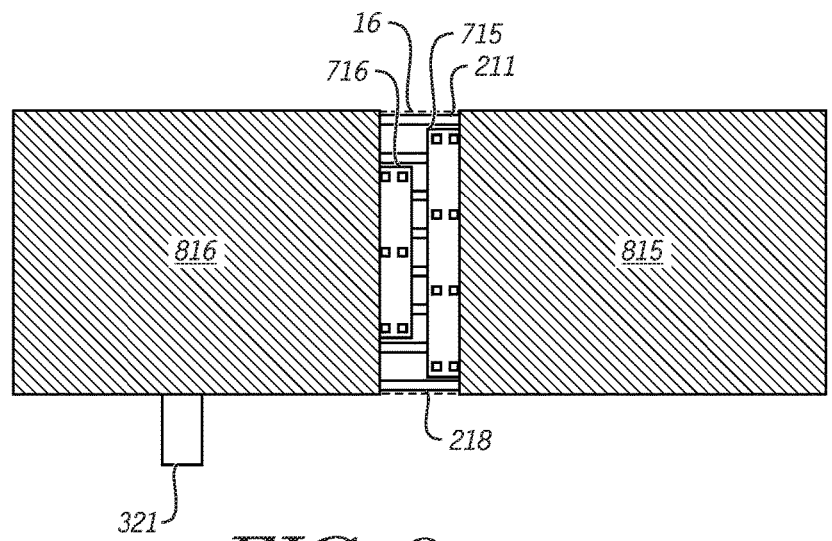
FIG. 9 is a top view of the field effect transistor of FIG. 1 showing various features at and below a particular level above that of FIG. 8.

FIG. 9 is an overhead view of FET 100 that illustrates the location of features that have been formed at or below the level 118 (FIG. 1), including a thick metal routing layer that is connected to various features of the fifth thin metal routing layer. For example, vias 708 connect the source and drain electrodes 815 and 816 of the thick metal routing layer to source and drain electrodes 715 and 716 of the fifth thin metal routing layer. According to an embodiment, the thickness of the thick metal routing layer of level 118 is at least twice that of the thin metal routing layer at level 117, but 850 nm would not be uncommon. Similarly, the vias 708 have a width that is at least twice as large as the widths of the vias 608, but 360 nm would not be uncommon. It will be appreciated that for an 850 nm thick metal layer that current can flow horizontally to the FET 100 through the sides of the thick electrodes 816 and 815 without the same electro-migration concerns that horizontal current flow create in the thin metal layers. Alternatively, additional overlying layers that are equally thick or even thicker than the routing layer of level 118 can be formed overlying and connected to electrodes 815 and 816 to facilitate vertical current flow to these electrodes.

The dimensions of the thick metal routing layer at level 118 can vary by process node. By way of example, for a 28 nm process node, the thickness of the thick metal routing layer at level 118 can be in the range of 180 nm to 1150 nm, or more. For a 40 nm process node, the routing layer at level 118 can be in the range of 280-850 nm.

It has been recognized by the inventors that reduction of parasitic capacitance between the source and drain electrodes can be of secondary concern relative to reduction of electro-migration effects for sufficiently thin local metal routing layers. In particular, it has been determined that optimization to reduce the detrimental effects of electro-migration is preferred over optimization to reduce the detrimental effects of parasitic capacitance between source and drain electrodes for routing layers with thickness less than about 250 nm. In particular, the inventors have developed insights into the allowed maximum current densities, and their relation to interconnect line and via width, before circuit reliability is compromised due to electro-migration damage. The multi-level interconnect scheme disclosed herein is advantageous in that it has been realized, for process nodes supporting sufficiently thin metal routing and via dimensions, that the vias between thin metal layers can be the limiting factor with respect to electro migration because the current carrying capability is given by the inter-metal transition with the least number of vias, and that extra vias between the other intermetal layers give an undesired extra capacitance between source and drain finger, while not adding extra electro-migration robustness. In addition, by evenly retracting metal fingers at each available metal layer by a similar amount, while maintaining a similar finger length, the amount of current that flows in the width direction of any given finger is equalized amongst fingers 315, 415, 515, and 615, thus balancing the current density in the width direction amongst the greatest number of fingers.

For example, as compared to other conventional comb-shaped FETs that reduce the number of source/drain electrode vias or finger widths at higher levels of thin metal routing, resulting in greater current flow along the width of a source/drain finger, a current increase can be realized. For example, evaluation of a conventional layout using a given 28 nm process node indicates about a five times increase in the obtained source/drain current can be achieved using the layout of the present disclosure. Improvements in source/drain current can be realized in process nodes having local metal routing layers having a thickness of about 250 nm or less.

Thus by dividing the source and drain currents over a maximum amount of vias, which is accomplished by maintaining substantially same number of vias between metal layers, which in turn is accomplished by maintaining substantially the same electrode width 91 and retraction 99, amongst source/drain electrode fingers and their overlying corresponding electrodes, a larger source/drain current density of the FET 100 can be maintained over device lifetime without incurring electro-migration damage in the fingers or the vias of the device. The term "substantially the same" as used herein with respect to the number of vias or contacts is intended to mean that the number of vias in the set having the smaller number of vias/contacts varies from the number of vias in the set having the larger number of vias/contacts by no more than a number of vias defined equal to 10% of the number of vias in the set having the larger number of vias, rounded down. For example, a set of nine vias would be substantially equal to a set of ten vias, but a set of eight vias would not bee substantially equal to a set of nine vias. The term "substantially the same" as used herein with respect to the width or length of source or drain of electrodes is intended to mean that the width or length of the shorter electrode is no more than 10% less than that of the longer electrode.

The present invention has been described with respect to particular embodiments and with reference to certain drawings but the invention is not limited thereto but only by the claims. The drawings and their written description are only representative and are non-limiting. In the drawings, the size of some of the elements may be exaggerated and not drawn on scale for illustrative purposes.

Figure 10:
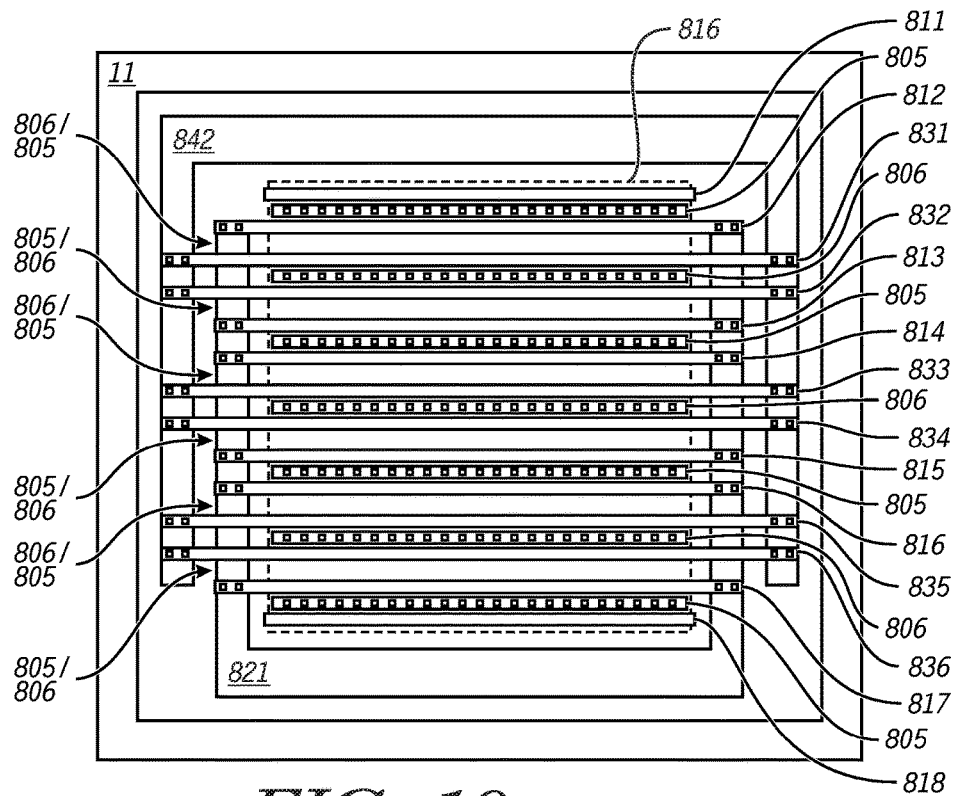
FIG. 10 is a top view of field effect transistors in a cascode configuration showing various features at and below a particular level according to a particular embodiment.

For example, it will be appreciated that while FET 100 has been described as an N-type FET, the same techniques can be used to form a p-type FET by reversing the polarities of the various diffusion regions. Furthermore, the same techniques can be beneficial in a cascode stage where the drains 106 of the first device are merged with the sources 105 of the second device, and contacts 108 and subsequent interconnects 315 415, 416, 515, 516, 615, 616, 715, 716, 815, 816, are only made to the sources 105 of the first device and the drains 106 of the second device. For example, referring to the overhead view of FIG. 10, feature 11 is a body contact as previously described, feature 821 is a double-ended gate electrode connected to gate structures 812-817 of a first transistor. These gate structures can correspond to gates 212-217 as previously described, where gates 811 and 818 are dummy gates. By way of example, the gate structures 812-817 are illustrated as double ended gates. Structures 805 are source electrode fingers corresponding to source electrode fingers 315 previously described, and are, therefore, connected to the source diffusion regions of the first transistor. Gate structures 831-836 correspond to the gates of a second transistor of the cascode stage, and are connected to a double-ended gate electrode 842. Structures 806 are drain electrode fingers that are connected to the source diffusion regions of the second transistor. Because the drains of the first transistor are connected to the sources of the second transistors at the diffusion level, see features labeled 805/806 and 806/805, there are no respective overlying drain and source electrodes for the first and second transistors. It will be appreciated that source and drain electrodes formed at subsequent levels can be retracted using the same techniques described previously.

In a first aspect, a device includes Filed Effect Transistor (FET) having a gate electrode, a comb-shaped drain electrode and a comb-shaped source electrode. The gate electrode overlies a channel region of the FET. The comb-shaped drain electrode electrically connected to a drain diffusion region of the FET, and having multiple comb-shape drain electrode layers at corresponding levels of the FET Each comb-shaped drain electrode layer includes a plurality of drain electrode fingers having a substantially same drain electrode finger width dimension in a first direction. The comb-shaped source electrode electrically connected to a source diffusion region of the FET, and having multiple comb-shaped source electrode layers at the corresponding levels. Each comb-shaped source electrode layer includes a plurality of source electrode fingers, interleaved with the plurality of drain electrode fingers, and having a substantially same source electrode finger width dimension in the first direction. A dimension of intra-level interleaving of the transistors source electrode fingers and drain electrode fingers being different at each one of the corresponding levels.

In one embodiment of the first aspect, the corresponding levels include a second level between a first level and a third level, and a number of vias connected between a first source electrode finger of the first level and a first source electrode finger of the second level is substantially the same as the number of vias connected between the first source electrode finger of the second level and a first source electrode finger of the third level. In a more particular embodiment of the one embodiment, a number of vias connected between a first drain electrode finger of the first level and a first drain electrode finger of the second level is substantially the same as the number of vias connected between the first drain electrode finger of the second level and a first drain electrode finger of the third level.

In another embodiment of the first aspect, the corresponding levels include a second level between a first level and a third level, and a number of vias connected between a first drain electrode finger of the first level and to a first drain electrode finger of the second level is substantially the same as the number of vias connected between the first drain electrode finger of the second level and a first drain electrode finger of the third level. In a further embodiment of the first aspect, an amount of inter-level retraction between adjacent comb-shaped drain electrode layers of a plurality of levels including a first level, a second level, and a third level is substantially the same. In yet a further embodiment of the first aspect, the drain electrode finger width dimension is greater than 1 micrometer. In still yet a further embodiment of the first aspect, the FET includes a thick metal layer at an upper level and a plurality of thin metal layers at lower levels between the upper level and a diffusion level, each thin metal layer including one of the comb-shaped drain electrode layers, and a thickness of the thick metal layer is greater that twice the thickness of any one of the thin metal layers. In still yet a further embodiment of the first aspect, the thickness of the thin metal layer is less than about 250 nm. In still yet a further embodiment of the first aspect, the source electrode finger width dimension is substantially the same as the drain electrode finger width dimension. In still yet a further embodiment of the first aspect, a ratio of the drain electrode finger width dimension and a drain electrode finger length dimension is at least 10 to 1.

In a second aspect, a method includes forming, at a semiconductor substrate, a gate electrode, a comb-shaped drain electrode, and a comb-shaped source electrode. The gate electrode formed over a channel region of a Field Effect Transistor (FET). The comb-shaped drain electrode formed to be electrically connected to a drain diffusion region. The comb-shaped drain electrode having multiple comb-shaped drain electrode layers at corresponding multiple levels overlying the semiconductor substrate. Each comb-shaped drain electrode layer including a plurality of drain electrode fingers having substantially the same drain electrode finger width dimension. The comb-shaped source electrode formed to be electrically connected to a source diffusion region. The comb-shaped source electrode having multiple comb-shaped source electrode layers at the corresponding multiple levels. Each comb-shaped source electrode layer including a plurality of source electrode fingers having substantially the same source electrode finger width dimension. An amount of intra-level interleaving of the drain electrode fingers and the source electrode fingers is different at each one of the corresponding levels.

In one embodiment of the second aspect, forming the comb-shaped drain electrode includes forming comb-shaped drain electrode layers at a first, second, and third level, the second level being between the first and third level. Forming a number of vias connected between a first drain electrode finger of the first level and a first drain electrode finger of the second level. Forming a number of vias connected between a first drain electrode finger of the third level and the corresponding first source electrode finger of the second level. Wherein, the number of vias connected between the first drain electrode finger of the first and second levels is substantially the same as the number of vias connected between the first drain electrode fingers of the second and third levels.

In another embodiment of the second aspect, forming the comb-shaped source electrode includes forming comb-shaped source electrode layers at a first, second, and third level. The second level being between the first level and the third level. Vias connected between a first source electrode finger of the first level and a first source electrode finger of the second level are formed. Vias connected between a first source electrode finger of the third level and the first source electrode finger of the second level are formed. Wherein, a number of vias connected between the first source electrode fingers of the first and second levels is substantially the same as the number of vias connected between the first source electrode fingers of the second and third levels.

In a further embodiment of the second aspect, an amount of inter-level retraction between adjacent comb-shaped drain electrode layers of the plurality of comb-shaped drain electrode layers is substantially the same. In a more particular embodiment of the further embodiment, an amount of retraction between adjacent comb-shaped source electrode layers of the plurality of comb-shaped drain electrode layers is substantially the same.

In yet a further embodiment of the second aspect, the source electrode finger width dimension is substantially the same as the drain electrode finger width dimension. In yet another further embodiment of the second aspect, the method includes forming an overlying drain electrode overlying the multiple comb-shaped drain electrode layers, wherein a thickness of the overlying drain electrode is at least twice as thick as the multiple comb-shaped drain electrode layers.

In a third aspect, a device includes a FET having a gate electrode overlying a channel region, a comb-shaped drain electrode, a comb-shaped source electrode, and vias. The comb-shaped drain electrode electrically connected to a drain diffusion region of the FET, and having multiple comb-shaped drain electrode layers at corresponding levels, each comb-shaped drain electrode layer including a plurality of drain electrode fingers. The a comb-shaped source electrode electrically connected to a source diffusion region of the FET, and having multiple comb-shaped source electrode layers at the corresponding levels. Each comb-shaped source electrode layer including a plurality of source electrode fingers interleaved with the plurality of drain electrode fingers. The vias including a number of vias between any two corresponding drain electrode fingers at adjacent levels is substantially the same. In one embodiment of the third aspect, a finger width of a drain electrode finger is less than one micrometer. In another embodiment of the third aspect, a number of vias between any two corresponding source electrode fingers at adjacent levels is substantially the same.

It will also be appreciated that the described number of vias and electrodes can vary from that shown. For example, embodiments having five to 20 vias connecting inter-level source/drain electrodes, and embodiments having four to 40 electrodes at each level of FET 100 would be considered most useful.

The term "substantially", and its variants, as used herein are intended to refer to the qualified article being sufficient to achieve the stated purpose or value in a practical manner, which includes taking into account any minor imperfections or deviations, if any, that arise from usual and expected abnormalities that may occur during device operation, which are not significant for the stated purpose or value. In addition, the term "substantially" has further been defined herein in the context of specific attributes to identify specific ranges.

What is claimed is:

1. A device comprising:
    a Field Effect Transistor (FET) having a gate electrode overlying a channel region,
    a comb-shaped drain electrode electrically connected to a drain diffusion region of the FET, and having multiple comb-shape drain electrode layers at corresponding levels of the FET, each comb-shaped drain electrode layer including a plurality of drain electrode fingers having a substantially same drain electrode finger width dimension in a first direction, wherein a number of vias between each two corresponding drain electrode fingers at adjacent levels is substantially the same;
    a comb-shaped source electrode electrically connected to a source diffusion region of the FET, and having multiple comb-shaped source electrode layers at the corresponding levels, each comb-shaped source electrode layer including a plurality of source electrode fingers, interleaved with the plurality of drain electrode fingers, and having a substantially same source electrode finger width dimension in the first direction, wherein a number of vias between each two corresponding source electrode fingers at adjacent levels is substantially the same; and
    a dimension of intra-level interleaving of the transistors source electrode fingers and drain electrode fingers being different at each one of the corresponding levels.

2. The field effect transistor of claim 1, wherein the corresponding levels include a second level between a first level and a third level, and a number of vias connected between a first source electrode finger of the first level and a first source electrode finger of the second level is substantially the same as the number of vias connected between the first source electrode finger of the second level and a first source electrode finger of the third level.

3. The field effect transistor of claim 2, wherein a number of vias connected between a first drain electrode finger of the first level and a first drain electrode finger of the second level is substantially the same as the number of vias connected between the first drain electrode finger of the second level and a first drain electrode finger of the third level.

4. The field effect transistor of claim 1, wherein the corresponding levels include a second level between a first level and a third level, and a number of vias connected between a first drain electrode finger of the first level and to a first drain electrode finger of the second level is substantially the same as the number of vias connected between the first drain electrode finger of the second level and a first drain electrode finger of the third level.

5. The field effect transistor of claim 1, wherein an amount of inter-level retraction between adjacent comb-shaped drain electrode layers of a plurality of levels including a first level, a second level, and a third level is substantially the same.

6. The field effect transistor of claim 1, wherein the drain electrode finger width dimension is greater than 1 micrometer.

7. The field effect transistor of claim 1, further having a thick metal layer at an upper level and a plurality of thin metal layers at lower levels between the upper level and a diffusion level, each thin metal layer including one of the comb-shaped drain electrode layers, and a thickness of the thick metal layer is greater that twice the thickness of any one of the thin metal layers.

8. The field effect transistor of claim 7, wherein the thickness of each thin metal layer is less than about 250 nm.

9. The field effect transistor of claim 1, wherein the source electrode finger width dimension is substantially the same as the drain electrode finger width dimension.

10. The field effect transistor of claim 1, wherein a ratio of the drain electrode finger width dimension and a drain electrode finger length dimension is at least 10 to 1.

11. A method comprising:
    forming, at a semiconductor substrate, a gate electrode over a channel region of a Field Effect Transistor (FET);
    forming a comb-shaped drain electrode electrically connected to a drain diffusion region, the comb-shaped drain electrode having multiple comb-shaped drain electrode layers at corresponding multiple levels overlying the semiconductor substrate, each comb-shaped drain electrode layer including a plurality of drain electrode fingers having substantially the same drain electrode finger width dimension, a number of vias between each two corresponding drain electrode fingers at adjacent levels is substantially the same; and
    forming a comb-shaped source electrode electrically connected to a source diffusion region, the comb-shaped source electrode having multiple comb-shaped source electrode layers at the corresponding multiple levels, each comb-shaped source electrode layer including a plurality of source electrode fingers having substantially the same source electrode finger width dimension, wherein a number of vias between each two corresponding source electrode fingers at adjacent levels is substantially the same, and wherein an amount of intra-level interleaving of the drain electrode fingers and the source electrode fingers is different at each one of the corresponding levels.

12. The method of claim 11, wherein forming the comb-shaped drain electrode includes forming comb-shaped drain electrode layers at a first, second, and third level, the second level being between the first and third level, forming a number of vias connected between a first drain electrode finger of the first level and a first drain electrode finger of the second level, forming a number of vias connected between a first drain electrode finger of the third level and the corresponding first source electrode finger of the second level, wherein the number of vias connected between the first drain electrode finger of the first and second levels is substantially the same as the number of vias connected between the first drain electrode fingers of the second and third levels.

13. The method of claim 11, wherein forming the comb-shaped source electrode includes forming comb-shaped source electrode layers at a first, second, and third level, the second level being between the first level and the third level, forming vias connected between a first source electrode finger of the first level and a first source electrode finger of the second level, forming vias connected between a first source electrode finger of the third level and the first source electrode finger of the second level, wherein a number of vias connected between the first source electrode fingers of the first and second levels is substantially the same as the number of vias connected between the first source electrode fingers of the second and third levels.

14. The method of claim 11, wherein an amount of inter-level retraction between adjacent comb-shaped drain electrode layers of the plurality of comb-shaped drain electrode layers is substantially the same.

15. The method of claim 14, wherein an amount of retraction between adjacent comb-shaped source electrode layers of the plurality of comb-shaped drain electrode layers is substantially the same.

16. The method of claim 11, wherein the source electrode finger width dimension is substantially the same as the drain electrode finger width dimension.

17. The method of claim 11 further comprising forming an overlying drain electrode overlying the multiple comb-shaped drain electrode layers, wherein a thickness of the overlying drain electrode is at least twice as thick as the multiple comb-shaped drain electrode layers.

18. A device comprising:
   a Field Effect Transistor (FET) having a gate electrode overlying a channel region,
   a comb-shaped drain electrode electrically connected to a drain diffusion region of the FET, and having multiple comb-shaped drain electrode layers at corresponding levels, each comb-shaped drain electrode layer including a plurality of drain electrode fingers;
   a comb-shaped source electrode electrically connected to a source diffusion region of the FET, and having multiple comb-shaped source electrode layers at the corresponding levels, each comb-shaped source electrode layer including a plurality of source electrode fingers interleaved with the plurality of drain electrode fingers;
   a number of vias between each two corresponding drain electrode fingers at adjacent levels is substantially the same; and
   a number of vias between each two corresponding source electrode fingers at adjacent levels is substantially the same.

19. The device of claim 18, wherein a finger width of a drain electrode finger is less than one micrometer.

20. The device of claim 18, wherein a number of vias between any two corresponding source electrode fingers at adjacent levels is substantially the same.

* * * * *